(12) United States Patent
Yamada et al.

(10) Patent No.: US 7,230,278 B2
(45) Date of Patent: Jun. 12, 2007

(54) OPTOELECTRONIC SEMICONDUCTOR DEVICE AND LIGHT SIGNAL INPUT/OUTPUT DEVICE

(75) Inventors: Hiroshi Yamada, Kanagawa-Ken (JP); Keiji Takaoka, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 18 days.

(21) Appl. No.: 10/929,522

(22) Filed: Aug. 31, 2004

(65) Prior Publication Data
US 2005/0087747 A1 Apr. 28, 2005

(30) Foreign Application Priority Data
Sep. 1, 2003 (JP) ............... 2003-308917

(51) Int. Cl.
*H01L 33/00* (2006.01)
(52) U.S. Cl. .............. 257/80; 257/81; 257/82
(58) Field of Classification Search ........ 257/80–82
See application file for complete search history.

(56) References Cited

U.S. PATENT DOCUMENTS

| | | | |
|---|---|---|---|
| 6,330,377 B1 * | 12/2001 | Kosemura | 385/14 |
| 6,477,286 B1 * | 11/2002 | Ouchi | 385/14 |
| 6,512,861 B2 | 1/2003 | Chakravorty et al. | |
| 2004/0212030 A1 * | 10/2004 | Asai | 257/432 |
| 2005/0063635 A1 * | 3/2005 | Yamada et al. | 385/14 |
| 2005/0089264 A1 * | 4/2005 | Johnson et al. | 385/15 |
| 2005/0180679 A1 * | 8/2005 | Shimizu et al. | 385/14 |

FOREIGN PATENT DOCUMENTS

| | | |
|---|---|---|
| JP | 2000-332301 | 11/2000 |
| JP | 2001-183556 * | 7/2001 |
| JP | 2001-185752 | 7/2001 |
| JP | 2002-329891 * | 11/2002 |
| JP | 2003-298167 | 10/2003 |
| JP | 2004-54003 * | 2/2004 |

* cited by examiner

*Primary Examiner*—Sue A. Purvis
*Assistant Examiner*—A. Sefer
(74) *Attorney, Agent, or Firm*—Finnegan, Henderson, Farabow, Garrett & Dunner, L.L.P.

(57) ABSTRACT

A optoelectronic semiconductor device, mountable on and electrically connectable to an electro-optical wiring board, a substrate thereof having a light input/output through-hole and electric connection through-holes, the light input/output through-hole being not formed in a stressed area of the circuit wiring board, but formed in a non-stressed area of the circuit wiring board, the stressed area being an area where a stress is larger in value than the mean value of stresses caused in the circuit wiring board by a difference in coefficient of thermal expansion between the circuit wiring board and the electro-optical wiring board when the electrode on the semiconductor optoelectronic device is mechanically fixed to and electrically connected to the electro-optical wiring board.

26 Claims, 4 Drawing Sheets

OPTOELECTRONIC SEMICONDUCTOR DEVICE AND LIGHT SIGNAL INPUT/OUTPUT DEVICE

CROSS-REFERENCE TO RELATED APPLICATION

This application is based upon and claims the benefit of priority from prior Japanese Patent Application No. 2003-308917, filed on Sep. 1, 2003, the entire contents of which are incorporated herein by reference.

BACKGROUND OF THE INVENTION

1. Field of the Invention

The present invention relates to an optoelectronic semiconductor device and a light signal input/output device.

2. Background Art

In recent years, optical interconnection technology has been seen as a leading technology for long-distance, large-capacity signal transmission. Optical interconnection technology uses light to transmit signals within an electronic device of a system and between electronic devices. For example, an optical subscriber line in an FTTH (Fiber To The Home) system is one kind of optical interconnection technology in a broad sense, as an optical fiber is used to transmit information from a center station to each subscriber.

Electrical signal transmission is known as one way of transmitting signals at a high speed. In order to improve the performance of electronic signal transmission modules, much research and development has been conducted on improving the performance of silicon LSIs. As a result, the operation speed and the integration scale of LSIs have been improved remarkably. However, with respect to the improvement of the performance of electronic signal transmission modules, there are still problems to be solved, i.e., the improvement of the transmission rate and the wiring density of electrical signal lines. Specifically, even if the performance of transistors and other functional elements in an LSI is improved, a lack of improvement of the transmission rate and the wiring density of electrical signal lines would serve as a rate limiting factor, and prevent the improvement in performance of electronic signal transmission modules. Furthermore, signal transmission delays in electrical signal transmission lines also serve as a limiting factor for the improvement in performance of electronic signal transmission modules. Even if a higher signal transmission rate and a higher wiring density of electrical boards can be achieved, the influence of EMI (Electromagnetic Interference) is still notable. For the aforementioned reasons, optical interconnection technology has been attracting attention as a technology for solving the above problems of the electronic signal transmission modules.

In optical interconnection technology, a light signal input/output device receives a light signal, performs a redetermined processing operation on the light signal, and then retransmits the processed light signal. In the light signal input/output device, an optoelectronic semiconductor device is provided on an electro-optical wiring board having electric wires and optical waveguides formed therein. The optoelectronic semiconductor device includes a photoreceptor or photodetector element, which receives a light signal from the optical waveguides and converts the light signal into an electronic signal; a semiconductor integrated circuit element, which processes the electronic signal from the photoreceptor; and a light emitting element, which converts the electronic signal from the semiconductor integrated circuit element into a light signal and retransmits the light signal to the optical waveguide. The light signal input/output device is disclosed in, for example, Japanese Patent Publication No. 2000-332301.

Optoelectronic semiconductor devices are becoming smaller and denser, and optoelectronic semiconductor devices of about 10 mm×10 mm in size are common. In order to effectively perform the miniaturization and the increase in density, the BGA (Ball Grid Array) mounting technique is seen as an effective technique for mounting an optoelectronic semiconductor device on an electro-optical wiring board. A BGA has a structure in which solder ball electrodes are arranged to form a grid. The BGA structure is smaller than that of a QFP (Quad Flat Package) using outer-lead electrode terminals since the solder ball electrodes occupy less space. Furthermore, the BGA structure incurs no such deformation of lead as will occur frequently with the QFP. Moreover, the surface tension of the solder balls being molten causes a self-alignment effect which automatically corrects a misalignment having occurred during the mounting of the optoelectronic semiconductor device. An optoelectronic semiconductor device employing the BGA structure is disclosed in Japanese Patent Publication No. 2001-185752, for example.

As optical interconnection technology is likely to become a higher density and higher speed communication technology for the next generation, it is essential to ensure a highly reliable connection between the optoelectronic semiconductor device and the electro-optical wiring board, and to accurately position them in relation to each other. For achieving such connection and positioning, the above-mentioned BGA mounting technique is particularly promising.

In a conventional optoelectronic semiconductor device using the BGA mounting technique, a cavity is formed in the lower of upper and lower sides of a circuit wiring board where solder ball electrodes are formed, and an optoelectronic semiconductor element and a semiconductor integrated circuit element are placed in the cavity so that the optoelectronic semiconductor element and the electro-optical wring board may face each other, as disclosed in Japanese Patent Publication No. 2001-185752. This method (cavity-down BGA) is effective for the improvement of the heat radiation characteristic as well as for miniaturizing the device. However, since the manufacturing cost of the circuit wiring board having the cavity is high, the packaging cost of the semiconductor device is also high.

There are optoelectronic semiconductor devices in which major consideration is given to a decrease in the manufacturing cost. In such a case, circuit elements can be provided on the upper side of a circuit wiring board while solder ball electrodes can be provided on the lower side of the circuit wiring board. In such an optoelectronic semiconductor device, it is necessary to form light input/output through-holes in the circuit wiring board in order to transfer a light signal between an optoelectronic semiconductor element and an electro-optical wiring board. However, it is considered extremely difficult to actually use this technique. That is, in optical interconnection technology, high density transmission is performed with an increased number of light signals. Accordingly, an increased number of light signals are used in the optoelectronic semiconductor device. Thus, the optoelectronic semiconductor device has many optoelectronic semiconductor elements provided therein. When circuit elements are provided on the upper side of the circuit wiring board, however, since they are disposed in the form of a one-dimensional array on the periphery of a semiconductor integrated circuit element, the size of the circuit wiring board increases. When the circuit wiring board becomes larger, a stress-induced strain caused by the difference in the coefficient of thermal expansion (CTE) between the circuit wiring board and the electro-optical wiring board also becomes larger. In addition, since the light input/output through-holes are formed in the circuit wiring board as described above, the strength of the circuit wiring board is decreased. Therefore, it has been believed that if the circuit elements are provided on the upper side of the circuit wiring board, a stress-induced strain would cause damage to the circuit wiring board, and/or would peel off the solder ball electrodes, thereby decreasing the reliability of the device.

BRIEF SUMMARY OF THE INVENTION

An optoelectronic semiconductor device, mountable on and electrically connectable to an electro-optical wiring board, according to a first aspect of the present invention includes:
an optoelectronic semiconductor element to receive a light signal, transmit a light signal or transmit and receive a light signal;
a semiconductor integrated circuit element electrically connected to the optoelectronic semiconductor element; and
a circuit wiring board comprising:
a substrate having:
first and second sides opposite to each other in the direction of the thickness, the optoelectronic semiconductor element and the semiconductor integrated circuit element being mounted on the first side;
a light input/output through-hole, the optoelectronic semiconductor element inputting/outputting a light signal via the light input/output through-hole; and
an electric connection through-hole, the semiconductor integrated circuit element inputting/outputting an electric signal via wiring layers filled in the electric connection through-holes; and
an electrode formed on the second side of the substrate, connected to the wiring layers filled in the electric connection through-holes, and mountable on and electrically connectable to the electro-optical wiring board,
the light input/output through-hole being not formed in a stressed area of the circuit wiring board, but formed in a non-stressed area of the circuit wiring board, the stressed area being an area where a stress is larger in value than the mean value of stresses caused in the circuit wiring board by a difference in coefficient of thermal expansion between the circuit wiring board and the electro-optical wiring board when the electrodes on the optoelectronic semiconductor device are mechanically fixed to and electrically connected to the electro-optical wiring board.

A light signal input/output device according to a second aspect of the present invention includes:
an electro-optical wiring board; and
semiconductor devices mounted on the electro-optical wiring device,
one of the semiconductor devices being an optoelectronic semiconductor device which comprises:
an optoelectronic semiconductor element to receive a light signal, transmit a light signal or transmit and receive a light signal;

a semiconductor integrated circuit electrically connected to the optoelectronic semiconductor element; and
a circuit wiring board comprising:
a substrate having:
first and second sides opposite to each other in the direction of the thickness, the optoelectronic semiconductor element and the semiconductor integrated circuit element being mounted on the first side;
a light input/output through-hole, the optoelectronic semiconductor element inputting/outputting a light signal via the light input/output through-hole; and
an electric connection through-holes, the semiconductor integrated circuit element inputting/outputting a electric signal via wiring layers filled in the electric connection through-holes; and
an electrode formed on the second side of the substrate, connected to the wiring layers filled in the electric connection through-holes, and mountable on and electrically connectable to the electro-optical wiring board, the light input/output through-hole being not formed in a stressed area of the circuit wiring board, but formed in a non-stressed area of the circuit wiring board, the stressed area being an area where a stress is larger in value than the mean value of stresses caused in the circuit wiring board by a difference in the coefficient of thermal expansion between the circuit wiring board and the electro-optical wiring board when the electrode on the optoelectronic semiconductor device is mechanically fixed to and electrically connected to the electro-optical wiring board.

DETAILED DESCRIPTION OF THE INVENTION

Hereinafter, an embodiment of the present invention will be described with reference to the accompanying drawings.

First, the basic structure and effects of a device according to the present invention will be illustrated and described, and then the materials, sizes, characteristics, detailed structures, etc. will be described in detail.

Figure 1:
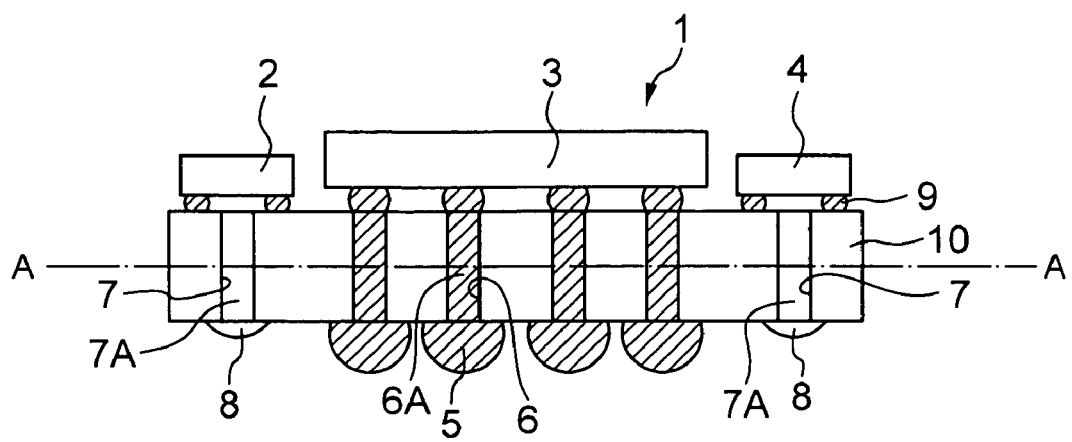
FIG. 1 is a cross-sectional view of an optoelectronic semiconductor device according to an embodiment of the present invention.
Figure 2:
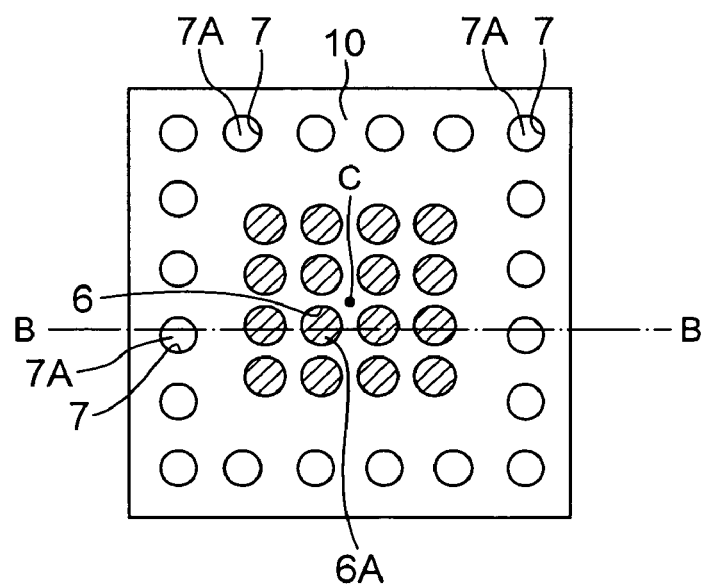
FIG. 2 is a plane-sectional view of the optoelectronic semiconductor device according to the embodiment of the present invention.

FIGS. 1 and 2 illustrate an optoelectronic semiconductor device 1 according to an embodiment of the present invention. FIG. 1 is a sectional view taken vertically. FIG. 2 is a sectional view, taken along dot-and-dash line AA, of a circuit wiring board 10 in FIG. 1. FIG. 1 is equivalent to a sectional view taken along dot-and-dash line BB in FIG. 2. It should also be noted that FIGS. 1 and 2 are shown in scales different from actual scales for the purpose of easy understanding.

As shown in FIG. 1, the optoelectronic semiconductor device 1 includes a semiconductor photoreceptor or photodetector element 2 which receives a light signal, a semiconductor integrated circuit element 3 electrically connected to the semiconductor photoreceptor element 2, and a semiconductor light emitting element 4 electrically connected to the semiconductor integrated circuit element 3. Elements 2 to 4 are mounted on a circuit wiring board 10. The circuit wiring board 10 is an SLC (Surface Laminar Circuit) board whose base plate is formed of glass epoxy, for example. The circuit wiring board 10 has front and rear sides opposite to each other, and a plurality of solder ball electrodes 5 formed on the front side (lower side in the drawing). The circuit wiring board 10 also has elements 2 to 4 mounted on the rear side (upper side in the drawing). As shown in FIGS. 1 and 2, the circuit wiring board 10 has electric connection through-holes 6 and light input/output through-holes 7. Each of the electric connection through-holes 6 has conductive electric wiring layers 6A filled therein, as shown by the hatching in FIG. 1. The solder ball electrodes 5, the semiconductor integrated circuit element 3, and the optoelectronic semiconductor elements 2 and 4 are electrically connected to each other by the electric wiring layers 6A filled in the electric connection through-holes 6, wiring lines on the circuit wiring board 10 (not shown) and bump electrodes 9. Also, each of the light input/output through-holes 7 has a light-transparent resin layer 7A filled therein. A micro lens 8 formed from a light-transparent resin is disposed at the bottom (lower side in the drawing) of each of the light input/output through-holes 7. Each of the semiconductor photoreceptor elements 2 receives a light signal from the lower side (in the drawing) through the micro lens 8 and the light-transparent resin layer 7A. Also, the semiconductor light emitting element 4 transmits a light signal downward (in the drawing) through these elements 8 and 7A.

As shown in FIG. 2, the circuit wiring board 10 of the optoelectronic semiconductor device 1 in FIG. 1 has sixteen electric connection through-holes 6 formed in the central region thereof and twenty light input/output through-holes 7 formed on the periphery thereof. Each of the sixteen electric connection through-holes 6 has one solder ball electrode 5 formed at the bottom thereof. The area of the region where the solder ball electrodes 5 are disposed equals less than a quarter of the surface area of the circuit wiring board 10. These solder ball electrodes 5 are formed around a center C of the circuit wiring board 10. A maximum of twenty optoelectronic semiconductor elements (2 and 4) are provided for the twenty light input/output through-holes 7. The circuit wiring board 10 shown in FIGS. 1 and 2 is 15 mm in width (W), 15 mm in depth (L) and 0.37 mm in thickness. In this circuit wiring board 10, the electric connection through-holes 6 are 250 µm in diameter and the light input/output through-holes 7 are 100 µm in diameter.

In the optoelectronic semiconductor device shown in FIGS. 1 and 2, the semiconductor photoreceptor element 2 receives a first light signal LSIN sent from the lower side of the optoelectronic semiconductor device 1 (in the drawing) and converts it into a first electronic signal. The first electronic signal is transmitted to the semiconductor integrated circuit element 3. The semiconductor integrated circuit element 3 processes and converts the first electronic signal into a second electronic signal, and outputs it from an output terminal. The second electronic signal is transmitted to the semiconductor light emitting element 4 which converts the second electronic signal into a second light signal and transmits it downward (in the drawing). In this way, the optoelectronic semiconductor device 1 in FIG. 1 receives the first light signal, performs a predetermined processing of the first light signal to convert it into the second light signal LSOUT, and transmits the second light signal LSOUT.

One of the characteristic features of the optoelectronic semiconductor device shown in FIG. 1 is that the solder ball electrodes 5 are provided on the front side of the circuit wiring board 10 (lower side in the drawing), and the optoelectronic semiconductor elements 2 and 4 are provided on the rear side of the circuit wiring board 10 (upper side in the drawing). The optoelectronic semiconductor elements transmit and receive light signals through the light input/output through-holes 7 formed on the periphery of the circuit wiring board 10, and the solder ball electrodes 5 are disposed in the central region on the rear side of the circuit wiring board 10 (lower side in drawing). In this manner, the present invention provides an inexpensive, highly reliable optoelectronic semiconductor device, as will further be described later.

Figure 3:
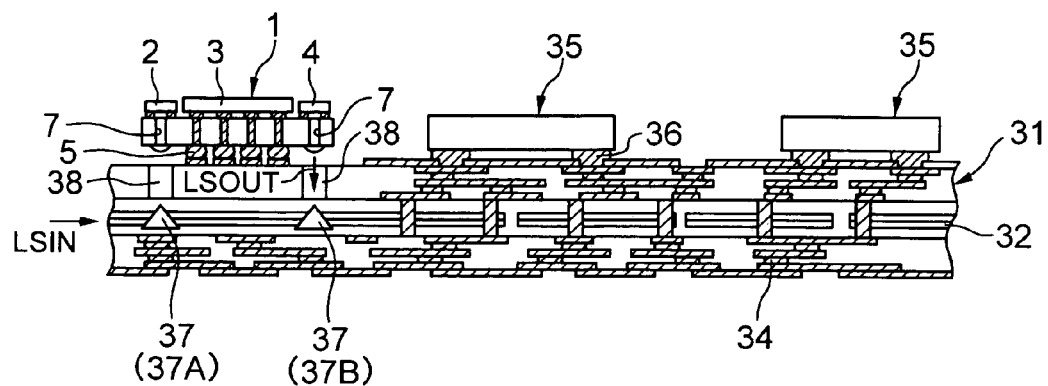
FIG. 3 is a cross-sectional view of a light signal input/output device according to the embodiment of the present invention.

The optoelectronic semiconductor device 1 in FIG. 1 is mounted on an electro-optical wiring board 31 shown in FIG. 3, and used as a light signal input/output device.

FIG. 3 illustrates the light signal input/output device according to the embodiment of the present invention. The light signal input/output device includes the optoelectronic semiconductor device 1 and LSI device 35 provided on the electro-optical wiring board 31. In addition, the electro-optical wiring board 31 includes optical waveguides 32, electric wiring layers 34, 45-degree mirrors 37 and light input/output portions 38.

In the light signal input/output device in FIG. 3, the first light signal LSIN is sent from the left side (in the drawing) along the optical waveguide 32. The first light signal LSIN is directed by the 45-degree mirror 37 (37A) upward (in the drawing), and is inputted to the semiconductor photoreceptor element 2 through the light input/output portion 38 and the light input/output through-hole 7 (light-transparent resin layer 7A) on the left side (in the drawing). The first light signal LSIN undergoes predetermined processing operations performed by the elements 2 to 4, and is re-transmitted as the second light signal LSOUT from the semiconductor light emitting element 4, as mentioned above. The second light signal LSOUT is resent downward in FIG. 3. The second light signal LSOUT is sent to the optical waveguide 32 again through the light input/output through-hole 7 (light-transparent resin layer 7A) and light input/output portion 38 at the right side (in the drawing), and then through the 45-degree mirror 37 (37B) at the right side (in the drawing). Then, the second light signal LSOUT travels through the optical waveguide 32 and in a right-hand direction (in the drawing). The above-mentioned LSI device 35 is caused to perform a predetermined operation by an electronic signal supplied from the electric wiring layer 34 via the bump electrode 36.

In the aforementioned optoelectronic semiconductor device 1 shown in FIG. 1 and the light signal input/output device shown in FIG. 3, the solder ball electrodes 5 are provided on the lower side (in the drawing) of the circuit wiring board 10, and the elements 2 to 4 are provided on the upper side opposite to the lower side. This makes the structure of the circuit wiring board 10 simpler, thereby reducing the manufacturing cost thereof. Furthermore, the elements 2 to 4 cannot be separated from the circuit wiring board 10 due to the force of gravity, as in a conventional structure in which the elements are provided on the lower surface. Accordingly, from the viewpoint of the manufacturing process, the cost of the optoelectronic semiconductor device and the light signal input/output device can be reduced.

Furthermore, since the optoelectronic semiconductor device 1 in FIG. 1 uses the solder ball electrodes 5, the size of the electrodes 5 and the optoelectronic semiconductor device 1 themselves can be decreased in comparison with the QFP (Quad Flat Package), in which the outer-lead-type electrode terminals are used.

Moreover, in the optoelectronic semiconductor device 1 in FIG. 1 and the light signal input/output device in FIG. 3, there are provided twenty light input/output through-holes 7. Accordingly, many optoelectronic semiconductor elements 2 and 4 can be provided. Thus, it is possible to maintain high performance even with an increased number of light signals.

In addition, in the optoelectronic semiconductor device 1 in FIG. 1, the destruction of the circuit wiring board 10 due to a stress-induced strain is prevented, and the separation of solder ball electrodes 5 from the circuit wiring board 10 is prevented. This improves the reliability of the connection. The optoelectronic semiconductor device 1 will further be described below in comparison with another optoelectronic semiconductor device of the inventors of the present invention (shown in FIGS. 4 and 5).

Figure 4:
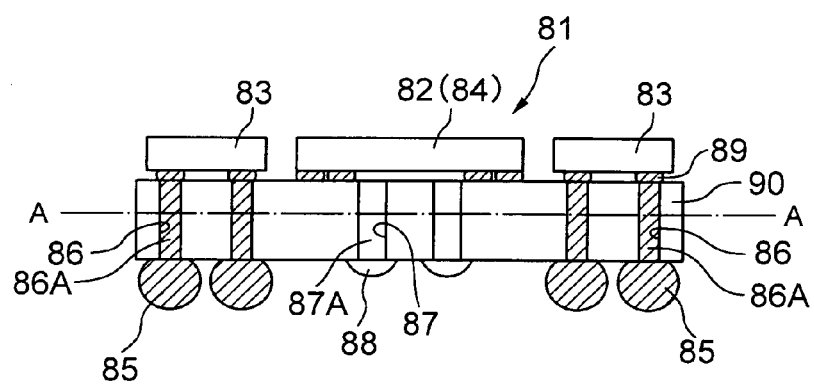
FIG. 4 is a cross-sectional view of another optoelectronic semiconductor device of the inventors of the present invention.
Figure 5:
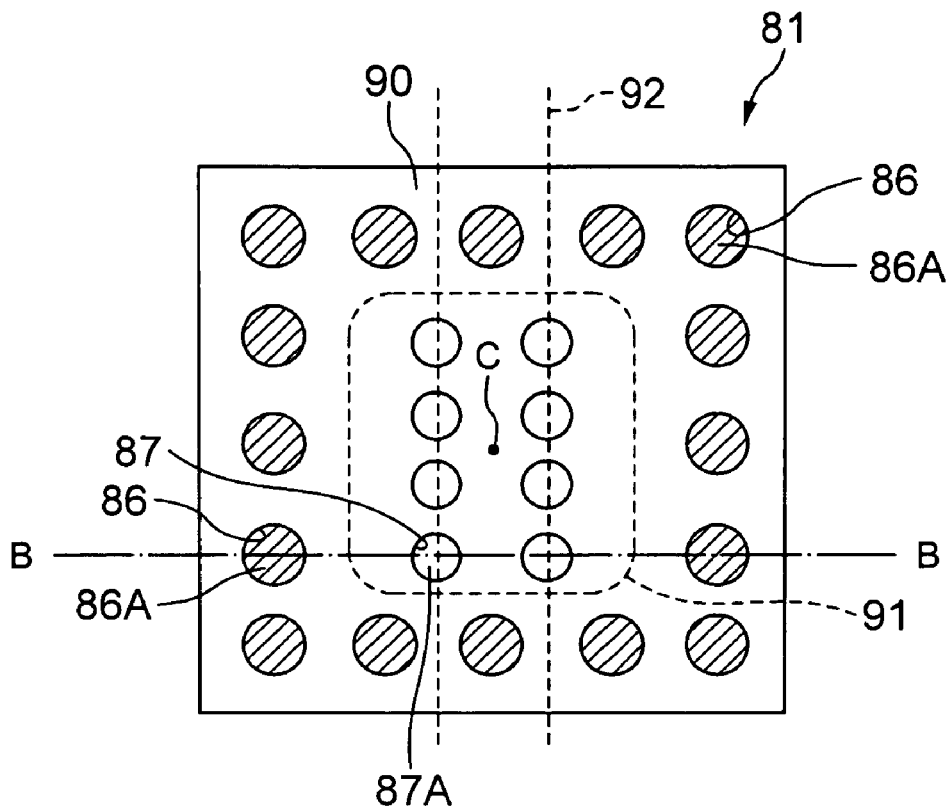
FIG. 5 is a plane-sectional view of another optoelectronic semiconductor device of the inventors of the present invention.

FIGS. 4 and 5 show a comparative optoelectronic semiconductor device 81. FIG. 4 is a cross-sectional view, corresponding to FIG. 1. FIG. 5 is a plane-sectional view, taken along dot-and-dash line A—A, of a circuit wiring board 90 in the optoelectronic semiconductor device 81 shown in FIG. 4, which corresponds to FIG. 2. The optoelectronic semiconductor device 81 shown in FIGS. 4 and 5 differs from the optoelectronic semiconductor device 1 in that light input/output through-holes 87 are formed in the central region of the circuit wiring board 90 and connecting through-holes 86 (each filled with electric wiring layers 86A) and solder ball electrodes 85 are provided on the periphery of the circuit wiring board 90. The rest of the optoelectronic semiconductor device 81 is similar to that of the optoelectronic semiconductor device 1 according to the embodiment of the present invention (as shown in FIGS. 1 and 2) and will not be described in detail. The circuit wiring board 90 has a size of 15 mm×15 mm, equal to that of the circuit wiring board 10 in the embodiment. The optoelectronic semiconductor device 81 in FIG. 4 is also mounted on an electro-optical wiring board 31 as shown in FIG. 3. Since the light input/output through-holes 87 (each filled with a light-transparent resin layer 87A) are formed in the central region of the optoelectronic semiconductor device 81 in FIGS. 4 and 5, the optical misalignment with the electro-opticalal wiring board 31 in the horizontal direction (in the drawing) is advantageously very small.

As described above, the optoelectronic semiconductor device 81 in FIG. 4 is to be used on the electro-optical wiring board 31. However, the circuit wiring board 90 in the optoelectronic semiconductor device 81 is different in coefficient of thermal expansion from the electro-optical wiring board 31. Therefore, the circuit wiring board 90 of the optoelectronic semiconductor device 81 is subjected to a strain due to stress caused by a heat cycle. In addition, since the solder ball electrodes 85 are formed on the periphery of the circuit wiring board 90 in the optoelectronic semiconductor device 81 in FIG. 4, a DNP (Distance from Neutral Point, namely, a distance from the center C of the circuit wiring board 90) of the solder ball electrodes 85 is large and the circuit wiring board 90 is somewhat large. This makes a stress-induced strain greater. On the assumption that a region in the circuit wiring board 90 where a stress-induced strain is larger than a mean value is a stressed region, a region defined by a dashed line and indicated with a reference 91 in FIG. 5 is the stressed area in the optoelectronic semiconductor device 81 shown in FIGS. 4 and 5. Since the light input/output through-holes 87 are provided in this stressed area 91 in the optoelectronic semiconductor device 81 in FIG. 5, the circuit wiring board 90 is weaker in the region around the through-holes 87. Therefore, in the optoelectronic semiconductor device 81 shown in FIGS. 4 and 5, the circuit wiring board 90 is disadvantageously easy to break along break lines 92 when a stress-induced strain is caused by the difference in coefficient of thermal expansion between the circuit wiring board 90 and the electro-optical wiring board 31.

On the contrary, in the optoelectronic semiconductor device 1 according to the embodiment of the present invention, shown in FIG. 1, the stressed area is the region surrounded by the outermost solder ball electrodes 5. Because of this, the light input/output through-holes 7 are formed on the periphery of the stressed area in the optoelectronic semiconductor device 1 as shown in FIG. 1. As a result, the stressed area of the circuit wiring board 10 in the semiconductor optoelectronic board 1 has a greater strength, thereby preventing the circuit wiring board 10 from being broken. Also, since the DNP (Distance from Neutral Point) of the solder ball electrodes 5 is small, it is possible to curb a stress-induced strain applied to the solder ball electrodes 5, and to prevent the solder ball electrodes 5 from being separated from the circuit wiring board 10. Thus, the interconnection reliability of the optoelectronic semiconductor device 1 shown in FIG. 1 can be improved.

However, it has conventionally been considered that in an optoelectronic semiconductor device and a light signal input/output device, it is difficult to provide the light input/output through-holes 7 on the periphery of the circuit wiring board 10 as in the optoelectronic semiconductor device 1 in FIG. 1. Specifically, it has been considered that if the light input/output through-holes 7 were provided on the periphery of the circuit wiring board 10, thermal expansion and contraction of the circuit wiring board 10 would cause a large optical misalignment, which would in turn result in fluctuations of the optical coupling efficiency and hence in a lower connection reliability. Also, the optoelectronic semiconductor device and the light signal input/output device are required to have the highest optical alignment accuracy. The inventors of the present invention know, through conducting many experiments, that when the collimator lens (micro lens) 8 is provided to each of the light input/output through-holes 7 as shown in FIG. 1, the optical coupling efficiency is not decreased very much in the case of the conventional optoelectronic semiconductor devices and light signal input/output devices. More specifically, according to the inventors' experiments, when the micro lens 8 was provided, the optical axes could be aligned horizontally (in the drawing) with each other with an accuracy of about ±5 to 10 μm at a temperature of −55 to 125° C. Also, the inventors' experiments revealed that the optoelectronic semiconductor device 1 constructed as shown in FIG. 1 can assure a sufficient efficiency of optical coupling and highly reliable interconnection.

In the light signal input/output device shown in FIG. 3, since the solder ball electrodes 5 are disposed on the front side of the circuit wiring board 10 of the optoelectronic semiconductor device 1 and the optoelectronic semiconductor elements 2 and 4 are disposed on the rear side of the circuit wiring board 10, the wiring board 31 and the optoelectronic semiconductor elements 2 and 4 are somewhat separated from each other. However, the collimator lenses (micro lens) 8 provided in the light signal input/output device in FIG. 3 maintain the optical coupling loss between the optoelectronic semiconductor device 1 and the electro-optical wiring board 31 at about the same level as that in the case of a conventional light signal input/output device. Thus, it is possible to maintain a high optical coupling efficiency.

Furthermore, the use of the solder ball electrodes 5 in the optoelectronic semiconductor device 1 shown in FIG. 1 ensures an accurate positioning of the optoelectronic semiconductor device 1 and the electro-optical wiring board 31 in relation to each other in the horizontal direction (in the drawing) due to the self-alignment effect. This feature also curbs the horizontal optical misalignment, thereby ensuring high reliability.

It should be noted, however, that because of the solder ball electrodes 5 provided in the optoelectronic semiconductor device 1 shown in FIG. 1, the distance between the electro-optical wiring board 31 and the optoelectronic semiconductor elements 2 and 4 mounted thereon is likely to vary. In the optoelectronic semiconductor device 1 shown in FIG. 1, however, it is possible to decrease the variation in the optical coupling efficiency by using the collimator lenses 8 even if such a variation in distance occurs, and thus it is possible to maintain high reliability.

Also, in the optoelectronic semiconductor device 1 in FIG. 1 and the light signal input/output device in FIG. 3, it is possible to improve the adhesion strength of the collimator lens 8 by forming each of the light-transparent resin layers 7A, and filling in the light input/output through-holes 7 and the collimator lenses 8 with the same resin material. Therefore, the optoelectronic semiconductor device 1 does not break easily even with the collimator lenses 8.

The optoelectronic semiconductor device 1 and the light signal input/output device are constructed as shown in FIGS. 1 and 3, respectively, as mentioned above. Thus, the present invention can provide a low-cost, highly reliable optoelectronic semiconductor device and light signal input/output device.

In the foregoing descriptions, the optoelectronic semiconductor device 1 of FIG. 1 uses the semiconductor photoreceptor element 2 and the semiconductor light emitting element 4 as the optoelectronic semiconductor elements. According to the present invention, however, either the semiconductor photoreceptor element 2 or the semiconductor light emitting element 4 can be used as the need arises.

Also, in the inventors' experiments, the solder ball electrodes 5 are formed in a central portion of the front side of the circuit wiring board 10 in the optoelectronic semiconductor device 1 in FIG. 1, in an area smaller than a quarter of the entire front-side surface area of the circuit wiring board 10. That is, the solder ball electrodes 5 are formed in a limited region. Experiments have proved that this arrangement could effectively improve the interconnection reliability of the solder ball electrodes 5.

EXAMPLE 1

Next, the optoelectronic semiconductor device 1 and the light signal input/output device will be described in more detail concerning their materials, dimensions, manufacturing methods and characteristics with reference to FIGS. 1 to 3. First, the materials, dimensions and manufacturing method of the optoelectronic semiconductor device 1 in FIG. 1, and then those of the light signal input/output device in FIG. 3 will be described. Finally, the characteristic features of the optoelectronic semiconductor device 1 and the light signal input/output device will be described.

First, the circuit wiring board 10 of the optoelectronic semiconductor device 1 in FIG. 1 will be described.

Figure 6:
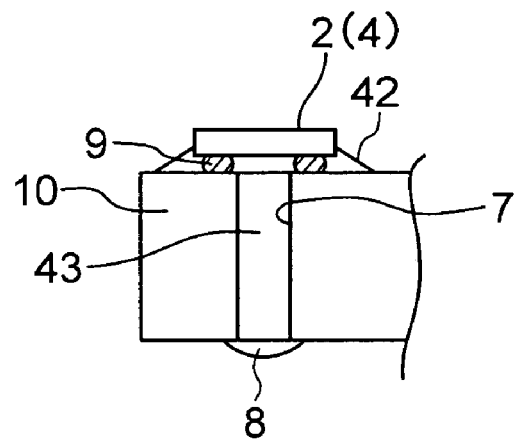
FIG. 6 shows a part of the optoelectronic semiconductor device according to a second example of the present invention.

The optoelectronic semiconductor elements 2 and 4 and the semiconductor integrated circuit 3 are mounted on the circuit wiring board 10. The circuit wiring board 10 can be a printed wiring board (SLC) formed by alternately building up insulation layers and conductive layers on a glass epoxy substrate, for example. Also, it is possible to use a multilayer flexible board including a polyimide resin substrate and copper wires built-up on the surface of the substrate or a build-up type ceramic multilayer board. Among such boards, the SLC board including the glass epoxy substrate as the base plate is used for the circuit wiring board 10 in this example. The circuit wiring board 10 is a double-sided copper-clad glass epoxy substrate 15 mm×15 mm in size, including a 0.37 mm-thick glass epoxy resin substrate and an 18 μm-thick copper foil laminated on the substrate. This glass epoxy resin substrate 10 has through-holes 6 of 250 μm in diameter and through-holes 7 of 100 μm in diameter drilled therethrough, as shown in FIG. 1. The through-holes 6 and 7 are then subjected to through-hole plating performed with electroless plating and electroplating. More particularly, the through-holes 6 of 250 μm in diameter are formed in the central portion of the glass epoxy resin substrate 10, and the through-holes 7 of 100 μm in diameter are formed on the periphery of the glass epoxy resin substrate 10, as shown in FIG. 2. Of these through-holes, each of the through-holes 6 of 250 μm in diameter is filled with an electric wiring layer which provides an electrical connection between the optoelectronic semiconductor elements 2 and 4 and the semiconductor integrated circuit element 3 and the solder ball electrodes 5. The through-holes 7 of 100 μm in diameter are used as light input/output through-holes for performing optical coupling of the optoelectronic semiconductor elements 2 and 4 with the electro-optical wiring board. Each of the light input/output through-holes 7 is filled with a light-transparent resin layer 43 (as shown in FIG. 6) to prevent the inner walls thereof from being electroless-plated.

The circuit wiring board 10 has a copper wiring pattern, an insulating layer and a build-up copper wiring layer formed in this order on the copper-plated through-holes. The circuit wiring board 10 having the aforementioned structure is produced in the following manner, for example.

First, the substrate having the copper-plated through-holes is covered with a resist. Then, a copper wiring pattern is pattern-etched as the resist design by using iron chloride (III). And the copper wiring pattern is designed to have a line/space ratio of 100/100 μm and through-hole land diameter of 550 μm, for example.

Next, a photosensitive epoxy resist is applied over the copper wiring pattern formed on the substrate, and then via holes are formed in appropriate positions by exposure and development, thereby forming an insulation layer of 30 μm in thickness. The via holes are designed to have a diameter of 75 μm and a land diameter of 150 μm.

Then, a build-up copper wiring layer of 18 μm in thickness is formed on the insulation layer. The copper-wiring pattern has a line/space ratio of 75/75 μm, for example.

Next, various layers are formed in the same manner as above to form the circuit wiring board 10 shown in FIG. 1. It should be noted that the wiring layer serving as the uppermost layer is designed to have a line/space ratio of 50/50 μm in consideration of the I/O terminal pitch of the semiconductor integrated circuit element, and that a solder resist of 120 μm in thickness is formed on the front and rear sides of the build-up substrate except for the regions of electrodes.

The circuit wiring board 10 in FIG. 1 is thus produced in the aforementioned manner.

Next, the optoelectronic semiconductor device 1 will be described concerning the optoelectronic semiconductor elements 2 and 4 and the semiconductor integrated circuit element 3, mounted on the rear side of the circuit wiring board 10, and the solder ball electrodes 5 provided on the front side of the circuit wiring board 10.

According to this example, the semiconductor light emitting element 4 is a vertical cavity surface emitting laser (VCSEL) element which emits light in a direction perpendicular to the circuit wiring board 10 or a vertical cavity surface emitting laser array formed of multiple vertical cavity surface emitting laser elements disposed in an array. The vertical cavity surface emitting laser element includes GaAs as an active layer (light-emitting layer). More specifically, an active layer (active region) formed from non-doped GaAs, for example, is formed between an n-type GaAlAs clad layer and a p-type GaAlAs clad layer, and a reflecting mirror formed of multiple layers is formed on the outer surface of each of the n-type and p-type GaAlAs clad layers. In this structure of the vertical cavity surface emitting laser element, laser light is emitted in the laminated direction of the clad and active layers by causing laser oscillation between the two reflecting mirrors. On the surface of the vertical cavity surface emitting laser element 4 from which laser light is emitted, there are disposed two types of electrodes, i.e., a p-type contact electrode and an n-type contact electrode. In the vertical cavity surface emitting laser array, eight-by-eight vertical cavity surface emitting laser elements are disposed on a chip sized 1 mm×1 mm at a pitch of 100 μm, for example. The electrodes are formed from Au/Ni/Ti, for example.

The semiconductor photodetector element 2 is a surface photodetector element or a surface photodetector element array formed of a number of surface photoreceptor elements disposed in an array. The surface photodetector element includes a PIN photodiode serving as a photoreceptor portion provided on an $n^+$-InP substrate, for example. The PIN photodiode includes a mesa portion and a peripheral portion. The photodiode has a laminated structure including an n-InP buffer layer of 1.5 μm in thickness ($n=10^{15}$ cm$^{-3}$), an n-$Ga_{0.47}In_{0.53}As$ absorption layer of 1.9 μm in thickness ($n=10^{15}$cm$^{-3}$) and an InP layer of 1.0 μm in thickness ($p=10^{16}$cm$^{-3}$) laid in this order from the substrate side.

The surface photodetector element 2 and vertical cavity surface emitting laser element 4 are connected to the circuit wiring board 10 by the bump electrodes 9 formed of solder balls of 50 μm in outside diameter and 50 μm in height. The optoelectronic semiconductor elements 2 and 4 are disposed on the light input/output through-holes 7. Because of this arrangement, a light signal emitted from the vertical cavity surface emitting laser element 4, for example, travels through the through-holes serving as light inputs, and are transmitted to the electro-optical wiring board. It should be noted that although the light signal transmitted through the through-holes or reflected at the inner walls of the through-holes is weaker than during the transmission or reflection in a light transmitter, such a transmission characteristic causes almost no problem because the length of the transmission distance is several tens millimeters. Although the material composition of the bump electrodes 9 is not limited to any special one so long as the material is electrically conductive, it should preferably be a metal selected primarily from Pb, Sn, Ag, Sb, In and Bi or an alloy containing any of them as a main ingredient. According to this example, the material of the bump electrodes 9 is Pb/Sn=95/5.

The semiconductor integrated circuit element 3 is electrically connected to the optoelectronic semiconductor elements 2 and 4, and mounted on the circuit wiring board 10 with the bump electrodes 9 of an eutectic solder of Pb/Sn=95/5 being laid between the circuit 3 and board 10.

The solder ball electrodes 5 are provided on the front surface (lower side in the drawing) of the circuit wiring board 10. The solder ball electrodes 5 should preferably be formed primarily from a metal selected from Pb, Sn, Ag, Sb, In and Bi or an alloy containing any of them as a main ingredient. Also, the melting temperature of the material should preferably be less than that of the metal used to form the bump electrodes 9. In this example, the material of the solder ball electrodes 5 is Pb/Sn=37/63.

The solder ball electrodes 5, the semiconductor integrated circuit element 3 and the optoelectronic semiconductor elements 2 and 4 are mounted on the aforementioned circuit wiring board 10 to produce the optoelectronic semiconductor device 1, as will be described below.

First, the flip-chip mounting technique is used to mount the semiconductor integrated circuit element 3 on the circuit wiring board 10 with the bump electrodes 9 being laid between the circuit element 3 and the board 10. More specifically, the semiconductor integrated circuit element 3 having the solder ball electrodes formed thereon is aligned with electrode terminals constituted by circuit wiring lines on the circuit wiring board 10, using a flip-chip bonder which has a half mirror and can position the mating elements. It should be noted that the semiconductor integrated circuit element 3 is held by a collet having a heating mechanism, and pre-heated in a nitrogen atmosphere at 350° C.

Next, the collect is further lowered with the bump electrodes 9 of the semiconductor integrated circuit element 3 and the electrode terminals of the circuit wiring board 10 being kept in touch with each other. Namely, a mechanical pressure of 30 kg/mm$^2$ is applied to put the bump electrodes 9 and the electrode terminals into close contact with each other. In this condition, the temperature is elevated up to 370° C. to melt the solder, which connects the electrode terminals of the circuit wiring board 10 to the respective bump electrodes 9 of the semiconductor integrated circuit 3. It should be noted that a sealing resin can be placed in a space defined between the semiconductor integrated circuit element 3 and the circuit wiring board 10 as necessary. It is possible to use the epoxy resin as the sealing resin, containing a bisphenol epoxy, a imidazole catalyst, acid anhydride as hardener, and spherical quartz filler in 45 percent by weight, and so on.

Next, the optoelectronic semiconductor elements 2 and 4 are mounted on the circuit wiring board 10 in the same manner as above with the flip-chip mounting technique. When a sealing resin is used, it is preferable that a light-transparent resin containing mainly polymethylmethacrylate (PMMA), deuterated-fluorinated PMMA, fluorinated polyimide, silicon, polycyclobutene or the like be used.

Then, the micro lenses (collimator lenses) 8 are provided at the front ends of the light input/output through-holes 7. A micro lens 8 is formed by dripping a small amount of ultraviolet-curable resin liquid onto a predetermined position, and with ultraviolet rays radiating the resin drip, which has been formed to be hemispheric due to the surface tension, to cure the drip, for example. In consideration of the possible light propagation loss, it is preferable that the micro lens 8 be formed from the same resin as that filled in the light input/output through-holes 7.

Further, a solder paste is screen-printed on the solder ball electrode terminals formed on the front side of the circuit wiring board using a screen-printing metal mask, and then the entire circuit wiring board is reflow-soldered. The solder paste is formed from Pb/Sn=37/63. The reflow-soldered BGA circuit wiring board is then washed with isopropyl alcohol for 10 minutes.

With the above steps of production, the optoelectronic semiconductor device 1 shown in FIG. 1 is formed.

Next, the light signal input/output device shown in FIG. 3 will be further described.

The light signal input/output device includes the aforementioned optoelectronic semiconductor device 1 and LSI devices 35 mounted on the electro-optical wiring board 31, as shown in FIG. 3. The electro-optical wiring board 31 may be an OE-MCM board, for example. More specifically, the electro-optical wiring board 31 is composed of an MCM board including a ceramic substrate having circuit wiring lines and build-up wiring lines formed thereon, optical waveguides which serve as optical wiring layers being formed on the MCM board by etching. The electro-optical wiring board may be a flexible board including a polyimide resin substrate serving as a base member and copper wiring lines built up on the surface of the substrate, or a build-up ceramic multilayer board, for example.

The optoelectronic semiconductor device 1 is mounted on the aforementioned electro-optical wiring board 31 in the following manner.

First, the optoelectronic semiconductor device 1 is roughly aligned with the electro-optical wiring board 31 using a bonder having a half tone mirror. At this time, a heater on which the optoelectronic semiconductor device 1 and the electro-optical wiring board 31 are mounted, and a collet holding the optoelectronic semiconductor device 1, have been heated to 180° C. Since this temperature is lower than the eutectic temperature of the solder forming the solder ball electrodes 5, the solder ball electrodes 5 are not melted.

Next, the solder ball electrodes 5 of the optoelectronic semiconductor device 1 are aligned with the electrodes on the electro-optical wiring board 31. With the solder ball electrodes 5 of the optoelectronic semiconductor device 1 being thus kept in touch with the electrodes on the electro-optical wiring board 31, the collet is further lowered to apply a pressure of 30 kg/mm². Then, the solder ball electrodes 5 are put into closer contact with the electrode terminals under the mechanical pressure. In this condition, the temperature is elevated up to 250° C. to melt the solder which connects the solder ball electrodes 5 of the optoelectronic semiconductor device 1 to the respective electrode terminals of the electro-optical wiring board 31. The composition of each solder ball is Pb/Sn=37/63. Since the composition of the bump electrodes 9 used to mount the optoelectronic semiconductor elements 2 and 4 and the semiconductor integrated circuit element 3 with the flip-chip mounting technique is Pb/Sn=95/5, the bump electrodes 9 of the optoelectronic semiconductor device 1 and the semiconductor integrated circuit element 3 cannot possibly be melted again to cause a poor connection. The connection reliability of the solder ball electrodes 5 can be improved by placing, only in the central portion of the circuit wiring board 10 where the solder balls 5 are disposed but not including the light input/output through-holes, an epoxy resin containing, 100 parts by weight of cresol novolak type epoxy resin (ECON-195XL by Sumitomo Chemical Co., Ltd.), 54 parts by weight of phenol resin serving as hardener, 100 parts by weight of silica serving as filler, 0.5 part by weight of benzildimethylamine serving as catalyst, 3 parts by weight of carbon black serving as additive and 3 parts by weight of silane coupling agent, for example.

The optoelectronic semiconductor device 1 is mounted on the electro-optical wiring board 31 as having been described above.

The performance of the optoelectronic semiconductor device 1 and the light signal input/output device, produced as described above, have been evaluated. The results of the evaluation will be described below.

In the light signal input/output device shown in FIG. 3, the light input/output through-holes 7 and the light input/output portions of the electro-optical wiring board 31 have to be aligned with each other with the highest level of accuracy. The accuracy of this alignment was measured, and was found to be approximately ±5 µm to 10 µm.

Next, the reliability of the optoelectronic semiconductor device 1 in FIG. 1 was evaluated. The evaluation test was done on an optical module in which the optoelectronic semiconductor device 1 is mounted on the electro-optical wiring board 31 as shown in FIG. 3. There were provided 64 solder ball electrodes in order to test many wiring lines. The optoelectronic semiconductor device 1 was evaluated to be defective when the connection of even one of the 64 solder ball electrodes 5 was found to be disconnected. As comparative samples, there were prepared optoelectronic semiconductor devices 81 each constructed as shown in FIG. 5 but having a substrate 90 of which the outside dimensions were 15.0 mm×15.0 mm, with 64 solder ball electrodes 85. A thousand of the samples were evaluated with a heat cycle test of −55° C. (for 30 min)~25° C. (for 5 min)~125° C. (for 30 min)~25° C. (for 5 min). The results of the evaluation showed that a failure connection occurred in some of the optoelectronic semiconductor devices constructed as in FIG. 5 after having passed 1,000 heat cycles, and that all the optoelectronic semiconductor devices incurred a failure connection after having passed 2,000 heat cycles. More specifically, the reason of the poor connection was that the solder ball electrodes 85 were broken due to a stress-induced strain concentrated locally thereon or that the substrate 90 was broken due to a stress. In contrast with this, the optoelectronic semiconductor device 1 constructed as shown in FIG. 2 incurred no failure connection before having passed 3,500 cycles. Also, the circuit wiring board 10 was not broken even after having passed 3,500 cycles. The results of the evaluation proved that the optoelectronic semiconductor device 1 constructed as shown in FIG. 1 has an improved connection reliability.

The above results of measurement and evaluation have revealed that even if the optoelectronic semiconductor device 1 shown in FIGS. 1 and 2 is mounted on the electro-optical wiring board 31 which is different in coefficient of thermal expansion from the optoelectronic semiconductor device 1, the circuit wiring board 10 of the optoelectronic semiconductor device 1 maintains a high connection reliability without any break-down of the circuit wiring board 10.

The first example having been illustrated and described can be modified in various manners without departing from the scope and spirit of the present invention as defined in the appended claims. The circuit wiring board used in the first example is an OE-MCM formed of a glass epoxy substrate, on which an electric wiring layer and an optical wiring layer are stacked. However, the circuit wiring board is not limited thereto but it can be an electro-optical wiring board having optical fibers formed thereon. Also, the optoelectronic semiconductor elements provided in the optoelectronic semiconductor device can include a photodetector element and a light emitting element. They may include a semiconductor integrated circuit element and a CR part, for example. Also, the structures of the optoelectronic semiconductor elements and semiconductor integrated circuit element mounted on the circuit wiring board are not limited to the aforementioned ones. Further, the space defined between the optoelectronic semiconductor elements and the circuit wiring board, the light input/output through-holes, and the light-transparent resin used to form the micro lenses are not limited to the aforementioned ones.

EXAMPLE 2

The second example is obtained by modifying the structure around each light input/output through-hole 7.

FIG. 6 shows a part of the optoelectronic semiconductor device 1 according to the second example of the present invention. FIG. 6 corresponds to an expanded view of a left-side portion of the optoelectronic semiconductor device in FIG. 1. The structure of the main parts of this portion is the same as that of the first example. Therefore, the structure will not be described in detail.

As shown in FIG. 6, a sealing resin layer 42 of a light-transparent resin is placed in a space between the optoelectronic semiconductor element 2 or 4 and the circuit wiring board 10. The sealing resin should preferably be a light-transparent resin containing mainly polymethylmethacrylate (PMMA), deuterated-fluorinated PMMA, fluorinated polyimide, silicon, epoxy, polycyclobutene or the like. Also, each of the light input/output through-holes 7 is filled with an infilling resin layer 43 which is formed from a light-transparent resin. The micro lens 8 of a light-transparent resin is formed under (in the drawing) each light input/output through-hole 7.

The sealing resin layer 42 placed as shown in FIG. 6 can protect the optoelectronic semiconductor elements 2 and 4, and reduce the light propagation loss.

The light propagation loss can be reduced further by forming the sealing resin layer 42, the infilling resin layer 43 and the micro lenses 8 from the same resin. More specifically, the optical coupling loss of the optoelectronic semiconductor elements 2 and 4 can be reduced to about 0.2 dB.

Next, modifications of the second example will be described.

Figure 7:
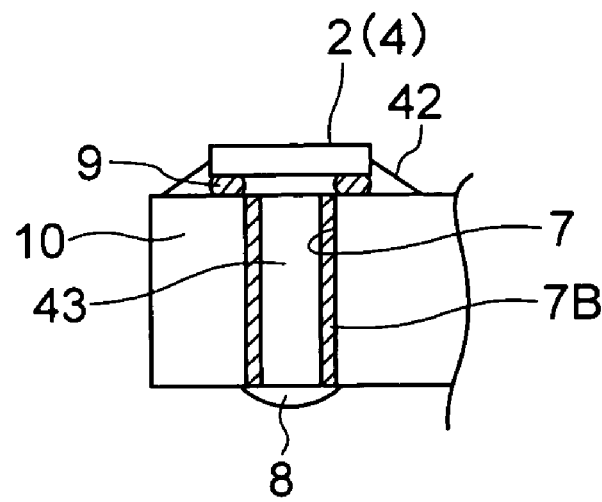
FIG. 7 shows a part of the optoelectronic semiconductor device according to a first modification of the second example of the present invention.

FIG. 7 shows a part of a first modification of the optoelectronic semiconductor device 1 according to the second example. In this modification, an electrically conductive member 7B, hatched in the drawing, is provided in a part of each light input/output through-hole 7 in order to provide a connection between the wiring lines on the upper side (in the drawing) of the circuit wiring board 10 and the solder ball electrodes 5. Thus, it is possible to reduce the number of electrical through-holes, that is, the number and area of electric connection through-holes 6, which have been the factors limiting a more compact design of the circuit wiring board 10, thereby providing a higher-density circuit wiring board, and achieving a more compact optoelectronic semiconductor device. More particularly, although the circuit wiring board 10 in the optoelectronic semiconductor device shown in FIG. 6 has a size of 15.0 mm×15.0 mm, the circuit wiring board shown in FIG. 7 can be 14.0 mm×14.0 mm in size while maintaining the same functions as those of the circuit wiring board in FIG. 6.

Figure 8:
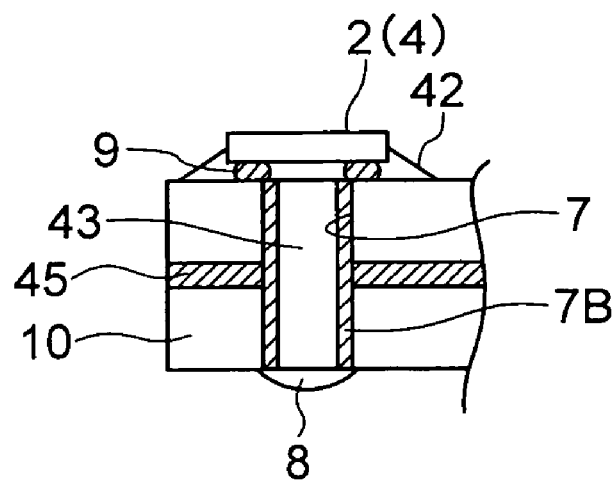
FIG. 8 shows a part of the optoelectronic semiconductor device according to a second modification of the second example of the present invention.

FIG. 8 shows a part of a second modification of the optoelectronic semiconductor device 1 according to the second example. The electrically conductive member 7B, hatched in the drawing, is provided in a part of each light input/output through-hole 7, and connected to the bump electrodes 9 of the optoelectronic semiconductor element 2 or 4. In addition, an electrical wiring layer 45 is provided in a part of the circuit wiring board 10. In this manner, the optoelectronic semiconductor device can be decreased in size further. More specifically, although the circuit wiring board 10 in the optoelectronic semiconductor device shown in FIG. 6 has a size of 15.0 mm×15.0 mm, the circuit wiring board shown in FIG. 8 can be 13.0 mm×13.0 mm in size while maintaining the same functions as those of the circuit wiring board in FIG. 6.

In each of the aforementioned optoelectronic semiconductor devices including the optoelectronic semiconductor elements to transmit and receive light signals, the circuit wiring board, and the solder ball electrodes according to the present invention, the solder ball electrodes are disposed on the front side of the circuit wiring board, and the optoelectronic semiconductor elements are disposed on the rear side of the circuit wiring board. The optoelectronic semiconductor elements are disposed on the periphery region of the rear side of the circuit wiring board to transmit and receive light signals through the light input/output through-holes formed along the periphery of the circuit wiring board, and the solder ball electrodes are disposed in the central region of the front side of the circuit wiring board. Accordingly, it is possible to curb a stress-induced strain caused by thermal expansion of the circuit wiring board applied to the solder ball electrodes and the circuit wiring board itself. As a result, there can be provided a optoelectronic semiconductor device lower in cost and higher in reliability, and a light signal input/output device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of general inventive concept as defined by the appended claims and their equivalents.

The invention claimed is:

1. An optoelectronic semiconductor device, mountable on and electrically connectable to an electro-optical wiring board, comprising:
   an optoelectronic semiconductor element to receive a light signal, transmit a light signal or transmit and receive a light signal;
   a semiconductor integrated circuit electrically connected to the optoelectronic semiconductor element; and
   a circuit wiring board comprising:
   a substrate having:
      first and second sides opposite to each other in the direction of the thickness, the optoelectronic semiconductor element and the semiconductor integrated circuit element being mounted on the first side;

a light input/output through-hole, the optoelectronic semiconductor element inputting/outputting a light signal via the light input/output through-hole; and a plurality of electric connection through-holes, the semiconductor integrated circuit element inputting/outputting an electric signal via wiring layers filled in the plurality of electric connection through-holes; and a plurality of electrodes formed on the second side of the substrate, connected to the wiring layers filled in the plurality of electric connection through-holes, and mountable on and electrically connectable to the electro-optical wiring board, the light input/output through-hole being not formed in a stressed area of the circuit wiring board, but formed in a non-stressed area of the circuit wiring board, the stressed area being an area where a stress is larger in value than a mean value of stresses caused in the circuit wiring board by a difference in coefficient of thermal expansion between the circuit wiring board and the electro-optical wiring board when one of the plurality of electrodes on the optoelectronic semiconductor device is mechanically fixed to and electrically connected to the electro-optical wiring board.

2. The device according to claim 1, wherein the semiconductor integrated circuit is mounted in a central region of the circuit wiring board, and the optoelectronic semiconductor element is mounted on a peripheral region of the circuit wiring board.

3. The device according to claim 2, wherein the plurality of electric connection through-holes are formed in the stressed area which is a region surrounded by outermost ones of plurality of the electrodes, and the stressed area is an area where a stress-induced strain is larger in value than the mean value of the stressed-induced strain of the circuit wiring board, and the light input/output through-hole is formed in an area other than the central region.

4. The device according to claim 3, wherein the plurality of electric connection through-holes are formed in the central region of the circuit wiring board and the light input/output through-hole is formed on the peripheral region of the circuit wiring board.

5. The device according to claim 4, wherein the plurality of electrodes are provided in electrical connection with the electric wiring layers filled in the plurality of electric connection through-holes.

6. The device according to claim 5, wherein the plurality of electrodes are ball electrodes which fix the optoelectronic semiconductor device to the electro-optical wiring board.

7. The device according to claim 4, wherein the light inputloutput through-hole is filled with a light-transparent resin that is transparent to the light signal, and a lens is formed on the light input/output through-hole at the second side of the circuit wiring board.

8. The device according to claim 7, wherein the lens is formed from the same material as the light-transparent resin.

9. The device according to claim 3, wherein inside the light input/output through-hole, an electrically conductive member is electrically connected to the optoelectronic semiconductor element.

10. The device according to claim 9, wherein the electrically conductive member is electrically connected to an electric wiring layer embedded in the circuit wiring board.

11. The device according to claim 4, wherein a space between the circuit wiring board and the optoelectronic semiconductor element mounted on the circuit wiring board is sealed by a resin.

12. The device according to claim 4, wherein a space between the circuit wiring board and the semiconductor integrated circuit element mounted on the circuit wiring board is sealed by a resin.

13. The device according to claim 4, wherein the optoelectronic semiconductor element is either a vertical cavity surface emitting laser or a surface photodetector element.

14. The device according to claim 4, wherein:

the optoelectronic semiconductor element includes a light emitting element and a photoreceptor element, which are provided on the peripheral region of the circuit wiring board and the semiconductor integrated circuit element is provided to an internal side of the optoelectronic semiconductor element; and wherein the light input/output through-hole is formed on the peripheral region of the circuit wiring board and the plurality of electric connection through-holes are formed to an internal side of the light input/output through-hole.

15. The device according to claim 1, wherein the plurality of electrodes are formed in the non-stressed area of the circuit wiring board in a matrix form.

16. The device according to claim 1, wherein the semiconductor integrated circuit is mounted on the first side of the circuit wiring board via bump electrodes which are connected to the wiring layers, the bump electrodes being formed so as to correspond to the plurality of electrodes, and being formed in a matrix form.

17. The device according to claim 1, wherein a light-transparent resin is filled in the light input/output through-hole.

18. A light signal input/output device comprising:

an electro-optical wiring board; and a plurality of semiconductor devices mounted on the electro-optical wiring board, one of the plurality of semiconductor devices being an optoelectronic semiconductor device which comprises:

an optoelectronic semiconductor element to receive a light signal, transmit a light signal or transmit and receive a light signal;

a semiconductor integrated circuit electrically connected to the optoelectronic semiconductor element; and a circuit wiring board comprising:

a substrate having:

first and second sides opposite to each other in the direction of the thickness, the optoelectronic semiconductor element and the semiconductor integrated circuit element being mounted on the first side;

a light input/output through-hole, the optoelectronic semiconductor element inputting/outputting a light signal via the light input/output through-hole; and a plurality of electric connection through-holes, the semiconductor integrated circuit element inputting/outputting a electric signal via wiring layers filled in the plurality of electric connection through-holes; and a plurality of electrodes formed on the second side of the substrate, connected to the wiring layers filled in the plurality of electric connection through-holes, and mountable on and electrically connectable to the electro-optical wiring board, the light input/output through-hole being not formed in a stressed area of the circuit wiring board, but formed in a non-stressed area of the circuit wiring board, the stressed area being an area where a stress is larger in value than a mean value of stresses caused in the circuit wiring board by a difference in coefficient of thermal expansion between the circuit wiring board and the electro-optical wiring board when one of the plurality of electrodes on the optoelectronic semiconductor device is mechanically fixed to and electrically connected to the electra-optical wiring board.

19. The device according to claim 18, wherein the semiconductor integrated circuit element is mounted in a central region of the circuit wiring board and the optoelectronic semiconductor element is mounted on a peripheral region of the circuit wiring board.

20. The device according to claim 19, wherein the plurality of electric connection through-holes are formed in the stressed area which is a region surrounded by outermost ones of the plurality of electrodes, and the stressed area is an area where a stress-induced strain is larger in value than the mean value of the stressed-induced strain of the circuit wiring board, and the light input/output through-hole is formed in an area other than the central region.

21. The device according to claim 20, wherein the plurality of electric connection through-holes are formed in the central region of the circuit wiring board and the light input/output through-hole is formed on the peripheral region of the circuit wiring board.

22. The device according to claim 21, wherein the plurality of electrodes are provided in electrical connection with the electric wiring layers filled in the plurality of electric connection through-holes.

23. The device according to claim 22, wherein the plurality of electrodes are ball electrodes which fix the optoelectronic semiconductor device to the electro-optical wiring board.

24. The device according to claim 18, wherein the plurality of electrodes are formed in the non-stressed area of the circuit wiring board in a matrix form.

25. The device according to claim 18, wherein the semiconductor integrated circuit is mounted on the first side of the circuit wiring board via bump electrodes which are connected to the wiring layers, the bump electrodes being formed so as to correspond to the plurality of electrodes, and being formed in a matrix form.

26. The device according to claim 18, wherein a light-transparent resin is filled in the light input/output through-hole.

* * * * *